US011557710B2

United States Patent
Chen et al.

(10) Patent No.: US 11,557,710 B2
(45) Date of Patent: Jan. 17, 2023

(54) FULLY-WET VIA PATTERNING METHOD IN PIEZOELECTRIC SENSOR

(71) Applicant: Taiwan Semiconductor Manufacturing Co., Ltd., Hsin-Chu (TW)

(72) Inventors: Ting-Jung Chen, Hsinchu (TW); Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 901 days.

(21) Appl. No.: 16/250,049

(22) Filed: Jan. 17, 2019

(65) Prior Publication Data

US 2020/0136010 A1    Apr. 30, 2020

Related U.S. Application Data

(60) Provisional application No. 62/753,358, filed on Oct. 31, 2018.

(51) Int. Cl.
*H01L 41/047* (2006.01)
*H01L 41/18* (2006.01)
(Continued)

(52) U.S. Cl.
CPC ...... *H01L 41/0477* (2013.01); *H01L 41/0471* (2013.01); *H01L 41/083* (2013.01);
(Continued)

(58) Field of Classification Search
CPC ............. H01L 41/0471; H01L 41/0472; H01L 41/0474; H01L 41/293; H01L 41/332; H01L 41/083; Y10T 29/42
See application file for complete search history.

(56) References Cited

U.S. PATENT DOCUMENTS 5,287,331 A * 2/1994 Schindel .............. H04R 17/005
29/25.35
8,278,802 B1 * 10/2012 Lee ..................... B81C 1/00476
29/25.35
(Continued)

FOREIGN PATENT DOCUMENTS

WO    WO-2004012331 A1 *  2/2004  ............... H03H 3/08

OTHER PUBLICATIONS

Johnson, R. Colin. "Startup's Piezoelectric MEMS Mics Show Superior Dynamic Range." Published online on Sep. 23, 2014. Retrieved online on Dec. 20, 2018 from http://www.eenewsanalog.com/news/startups-piezoelectric-mems-mics-show-superior-dynamic-range.

*Primary Examiner* — Jeffrey T Carley
(74) *Attorney, Agent, or Firm* — Eschweiler & Potashnik, LLC

(57) ABSTRACT

Various embodiments of the present disclosure are directed towards a method for forming a piezoelectric device including a piezoelectric membrane and a plurality of conductive layers. The method includes forming the plurality of conductive layers in the piezoelectric membrane, the plurality of conductive layers are vertically offset one another. A masking layer is formed over the piezoelectric membrane. An etch process is performed according to the masking layer to concurrently expose an upper surface of each conductive layer in the plurality of conductive layers. A plurality of conductive vias are formed over the upper surface of the plurality of conductive layers.

20 Claims, 9 Drawing Sheets

(51) Int. Cl.
*H01L 41/083* (2006.01)
*H01L 41/293* (2013.01)
*H01L 41/332* (2013.01)

(52) U.S. Cl.
CPC ............ *H01L 41/18* (2013.01); *H01L 41/293* (2013.01); *H01L 41/332* (2013.01); *Y10T 29/42* (2015.01)

(56) References Cited

U.S. PATENT DOCUMENTS

| | | | |
|---|---|---|---|
| 9,691,778 B2* | 6/2017 | Izumi | H01L 27/11582 |
| 2003/0000058 A1* | 1/2003 | Tsai | H03H 3/02 |
| | | | 29/25.35 |
| 2006/0267459 A1 | 11/2006 | Shelby | |
| 2007/0146438 A1* | 6/2007 | Tanaka | B41J 2/1646 |
| | | | 347/68 |
| 2010/0045145 A1* | 2/2010 | Tsuda | H03H 9/1085 |
| | | | 29/25.35 |
| 2010/0225205 A1 | 9/2010 | Glazunov | |
| 2012/0050236 A1 | 3/2012 | Lo | |
| 2012/0216378 A1* | 8/2012 | Emley | H01L 41/27 |
| | | | 29/25.35 |
| 2016/0365502 A1 | 12/2016 | Saito | |
| 2017/0066014 A1* | 3/2017 | Kidwell, Jr. | B81B 3/0021 |
| 2017/0301853 A1* | 10/2017 | Xia | H01L 41/29 |
| 2019/0036003 A1* | 1/2019 | Xia | H01L 41/0533 |

* cited by examiner

FULLY-WET VIA PATTERNING METHOD IN PIEZOELECTRIC SENSOR

REFERENCE TO RELATED APPLICATION

This Applications claims priority to U.S. Provisional Application No. 62/753,358, filed on Oct. 31, 2018, the contents of which are hereby incorporated by reference in their entirety.

BACKGROUND

Piezoelectric devices (e.g., piezoelectric actuators, piezoelectric sensors, etc.) are used in many modern day electronic devices (e.g., automotive sensors/actuators, aerospace sensors/actuators, speakers, micro-speakers, microphones, smart phones, hearing aids, etc.). The piezoelectric devices can be used to translate between movement of a physical part in a system and an electrical signal. The physical movement generated or observed by a piezoelectric device can be used to transmit or receive different kinds of signals for mechanical systems, audio systems, and/or optical systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
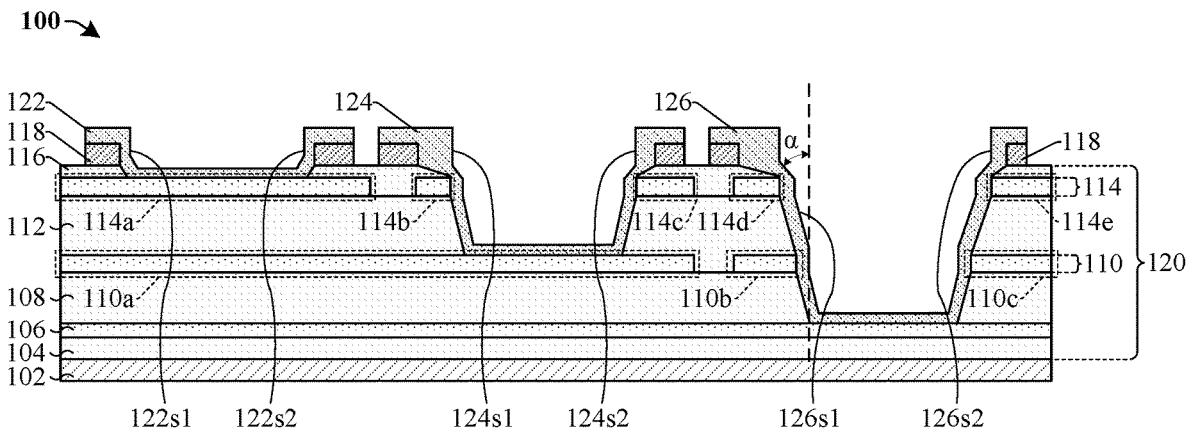
FIG. 1 illustrates a cross-sectional view of some embodiments of a piezoelectric structure including a piezoelectric membrane with a plurality of vias and electrodes.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some piezoelectric devices (e.g., piezoelectric transducers) include a plurality of piezoelectric layers stacked on top of one another and separated by a plurality of electrodes. A plurality of vias extend through the plurality of piezoelectric layers at different locations to directly contact the plurality of electrodes, such that a single via is electrically coupled to a single electrode. Having a plurality of piezoelectric layers within a piezoelectric device can improve a performance of the device (e.g., by allowing the transducer to generate a larger force in response to applied signals or to generate larger signals in response to an applied force).

During formation of such a multi-layered piezoelectric device, a plurality of electrodes are formed between a plurality of piezoelectric layers so that each electrode is vertically offset from other electrode(s) by at least one piezoelectric layer. Typically, via openings overlying the plurality of electrodes are formed by separate etching processes (e.g., multiple dry etch processes followed by at least one wet etch). For example, a first photomask may be used to pattern a first masking layer comprising sidewalls defining a first via opening directly over a first electrode of the plurality of electrodes. A first dry etching process is subsequently performed according to the first masking layer to form the first via opening. A second photomask is then used to pattern a second masking layer comprising sidewalls defining a second via opening directly over a second electrode of the plurality of electrodes. A second dry etching process is subsequently performed according to the second masking layer to form the second via opening. A wet etching process is then performed to remove any remnants of the piezoelectric materials directly above the exposed upper surface of the first and second electrodes. A conductive film is formed over the upper surface of the first and second electrodes and subsequently etched to define first and second conductive vias. It may be appreciated that the aforementioned process may be repeated for any number of electrodes and conductive vias (e.g., for N electrodes and N vias such that N is a positive whole number).

A challenge with the above method is in a complexity of the method, which uses a photomask and etch process for the formation of each conductive via. For example, if there are N electrodes and N vias, then at least N photomasks and N+1 etch processes are used to form the aforementioned piezoelectric device. The complexity of the method also includes a long time (i.e., time used to pattern N masking layers and perform N+1 etch processes) and high costs (i.e., cost to form N photomasks) associated with the formation of the piezoelectric device.

In some embodiments, the present disclosure relates to a method that simplifies the fabrication of a multi-layered piezoelectric device by reducing the number of photolithography and etch processes used during the fabrication. For example, to eliminate the use of N photomasks and N+1 etch processes to form N conductive vias over N electrodes, the N conductive vias may be formed according to a self-alignment technique. In some embodiments, a piezoelectric membrane is formed to have N electrodes separated from one another by a respective piezoelectric layer in the N piezoelectric layers. The N electrodes are formed such that N regions with non-conductive materials exist directly above each electrode. Each region extends from an upper surface of an electrode to a topmost piezoelectric layer. The N regions are laterally offset from one another. A masking layer is formed over the piezoelectric device comprising sidewalls defining N openings. The N openings are vertically aligned above the N regions. An etch process (e.g., a wet etch process) is performed to remove materials within the N regions and concurrently expose the upper surface of each electrode, thus defining N via openings. A conductive film is formed over the upper surface of each electrode and subsequently etched to define N conductive vias in the N via openings.

Therefore, the disclosed method uses one photomask and two etching processes (e.g., one to pattern the masking layer and one to pattern the N piezoelectric layers) to form a piezoelectric device having N conductive vias over N electrodes. The disclosed method mitigates the use of N photomasks and N+1 etch processes to form N conductive vias over N electrodes (i.e., the new method utilizes a single photomask and two etching processes to form N conductive vias over N electrodes), thus reducing costs and time to form the piezoelectric device.

Referring to FIG. 1, a cross-sectional view of a piezoelectric structure 100 in accordance with some embodiments is provided.

The piezoelectric structure 100 includes a piezoelectric membrane 120 overlying a substrate 102. The piezoelectric membrane 120 comprises a plurality of piezoelectric layers 104, 108, 112, 116. A plurality of conductive layers 106, 110, 114 are vertically separated from one another by the plurality of piezoelectric layers 104, 108, 112, 116. A masking layer 118 overlies a top piezoelectric layer 116. A plurality of conductive vias 122, 124, 126 extend through the piezoelectric membrane 120 and overlie the plurality of conductive layers 106, 110, 114. In various embodiments, the plurality of conductive layers 106, 110, 114 may comprise any number of conductive layers (e.g., 2 conductive layers, 3 conductive layers, 4 conductive layers, etc.)

In some embodiments, the plurality of conductive layers may comprise a bottom conductive layer 106, a middle conductive layer 110, and a top conductive layer 114. In such embodiments, the bottom conductive layer 106 comprises a bottom electrode that underlies a first piezoelectric layer 108 and that is electrically coupled to a third conductive via 126. The middle conductive layer 110 overlies the first piezoelectric layer 108. The middle conductive layer 110 comprises a middle electrode 110a, a first middle conductive segment 110b, and a second middle conductive segment 110c. The middle electrode 110a is electrically isolated from the first and second middle conductive segments 110b, 110c. The middle electrode 110a is electrically coupled to a second conductive via 124. A second piezoelectric layer 112 overlies the middle conductive layer 110. The top conductive layer 114 overlies the second piezoelectric layer 112. The top conductive layer 114 comprises a top electrode 114a, a first top conductive segment 114b, a second top conductive segment 114c, a third top conductive segment 114d, and a fourth top conductive segment 114e. The top electrode 114a is electrically coupled to a first conductive via 122 and is electrically isolated from the first, second, third, and fourth top conductive segments 114b, 114c, 114d, 114e by a top piezoelectric layer 116.

Opposing sidewalls 122s1, 122s2 of the first conductive via 122 conformally extend along sidewalls of the masking layer 118 and sidewalls of the top piezoelectric layer 116, respectively. Opposing sidewalls 124s1, 124s2 of the second conductive via 124 conformally extend along sidewalls of the masking layer 118, sidewalls of the top piezoelectric layer 116, a sidewall of the first and second top conductive segments 114b, 114c, and sidewalls of the second piezoelectric layer 112, respectively. Opposing sidewalls 126s1, 126s2 of the third conductive via 126 conformally extend along sidewalls of the masking layer 118, sidewalls of the top piezoelectric layer 116, a sidewall of the third and fourth top conductive segments 114d, 114e, sidewalls of the second piezoelectric layer 112, a sidewall of the first and second middle conductive segments 110b, 110c, and sidewalls of the first piezoelectric layer 108, respectively.

The opposing sidewalls of the one or more of the plurality of conductive vias 122, 124, 126 (e.g., opposing sidewalls 122s1, 122s2, opposing sidewalls 124s1, 124s2, and opposing sidewalls 126s1, 126s2) may be oriented at a non-zero angle α with respect to a line that is perpendicular to an upper surface of the substrate 102. In some embodiments, an orientation of opposing sidewalls of one or more of the plurality of conductive vias 122, 124, 126 may be substantially equal. For example, an orientation of opposing sidewalls 124s1, 124s2 may be substantially equal to an orientation of opposing sidewalls 126s1, 126s2. In some embodiments, the opposing sidewalls may be oriented at a non-zero angle α that is in a range of between approximately 20° and approximately 70°. The orientation of the opposing sidewalls (e.g., opposing sidewalls 122s1, 122s2, opposing sidewalls 124s1, 124s2, and opposing sidewalls 126s1, 126s2) is a result of a single wet etching process that is used to simultaneously form via openings containing the plurality of conductive vias 122, 124, 126, and that thereby reduces a cost and complexity of fabricating the piezoelectric structure 100.

In some embodiments, during operation of the piezoelectric structure 100 a voltage is applied between at least two conductive vias within the plurality of conductive vias 122, 124, 126. An electric field generated by the applied voltage can cause the plurality of piezoelectric layers 104, 108, 112, 116 within the piezoelectric membrane 120 to change from a first shape to a second shape (not shown). This change in shape may be used to control various kinds of systems (e.g., audio systems, mechanical systems, optical systems, etc.) or generate soundwaves. In other embodiments, during operation of the piezoelectric structure 100 a force (e.g., pressure from an incident sound wave) may be applied to the piezoelectric membrane 120. The force causes a voltage to be generated by the plurality of piezoelectric layers 104, 108, 112, 116. The voltage may be coupled by way of the plurality of conductive vias 122, 124, 126 to a logic devices (e.g., a digital signal processor)(not shown) that is configured to convert the voltage to a signal (e.g., a digital signal).

Figure 2:
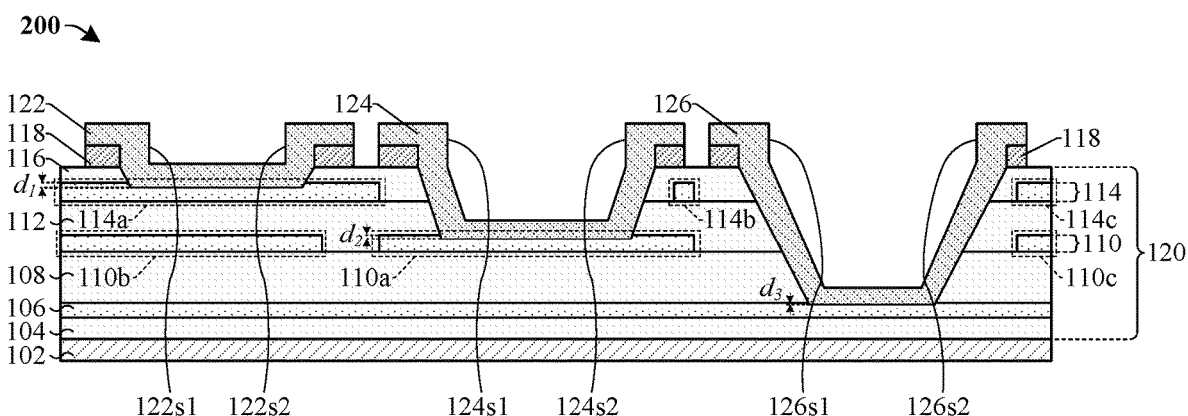
FIGS. 2 and 3 illustrate cross-sectional views of some alternative embodiments of the piezoelectric structure of FIG. 1.

Referring to FIG. 2, a cross-sectional view of a piezoelectric structure 200 according to some alternative embodiments of the piezoelectric structure 100 of FIG. 1 is provided.

The piezoelectric structure 200 illustrates an embodiment of the piezoelectric structure (100 of FIG. 1) in which the plurality of conductive layers 106, 110, 114 have a different layout. This different layout, in turn, results in the first, second, and third conductive vias 122, 124, 126 directly contacting the top electrode 114a, the middle electrode 110a, and the bottom conductive layer 106, respectively, without contacting other conductive segments within the piezoelectric membrane 120. Therefore, the opposing sidewalls 122s1, 122s2 of the first conductive via 122 are vertical. The opposing sidewalls 124s1, 124s2 of the second conductive via 124 respectively comprise a vertical segment overlying a slanted segment. The opposing sidewalls 126s1, 126s2 of the third conductive via 126 respectively comprise a vertical segment overlying a slanted segment.

In some embodiments, the first conductive via 122, the second conductive via 124, and the third conductive via 126 may contact uppermost surfaces of the top electrode 114a, the middle electrode 110a, and the bottom conductive layer 106. In other embodiments, the first via 122 may extend to a first distance $d_1$ below a topmost surface of the top electrode 114a, the second via 124 may extend to a second distance $d_2$ below a topmost surface of the top middle electrode 110a and the third via 126 may extend a third distance $d_3$ below a topmost surface of the bottom conductive layer 106. In some embodiments, the first distance $d_1$ may be larger than the second distance $d_2$ and the second distance $d_2$ may be larger than the third distance $d_3$.

Figure 3:
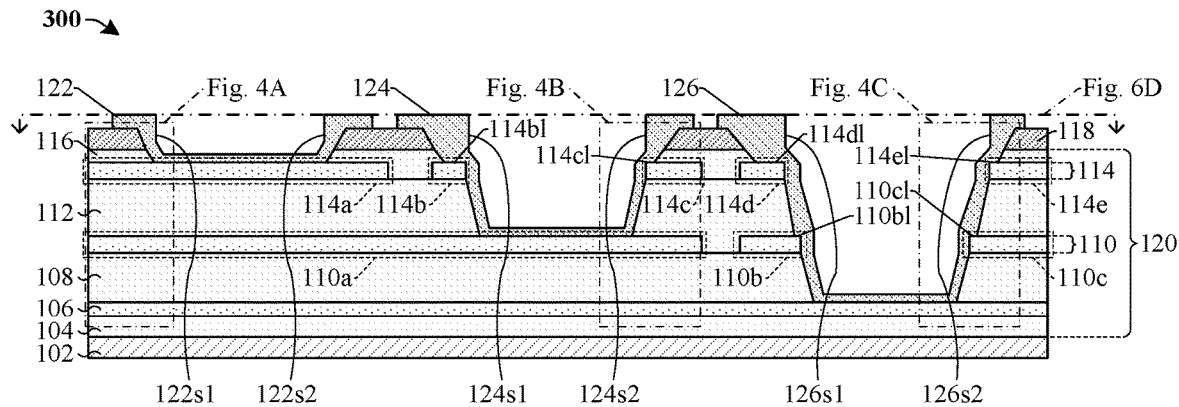

Referring to FIG. 3, a cross-sectional view of a piezoelectric structure 300 according to some alternative embodiments of the piezoelectric structure 100 of FIG. 1 is provided.

The piezoelectric structure 300 includes the piezoelectric membrane 120 overlying the substrate 102. During formation of the piezoelectric structure 300, an etch of the piezoelectric membrane 120 results in the formation of a ledge of each conductive segment in the plurality of conductive layers 106, 110, 114. Thus, a first sidewall 124s1 of the second conductive via 124 conformally extends along a sidewall of the masking layer 118, a sidewall of the top piezoelectric layer 116, a ledge 114b1 of the first top conductive segment 114b, a sidewall of the first top conductive segment 114b, and a sidewall of the second piezoelectric layer 112. Similarly, a second sidewall 124s2 of the second conductive via 124 conformally extends along a sidewall of the masking layer 118, a sidewall of the top piezoelectric layer 116, a ledge 114c1 of the second top conductive segment 114c, a sidewall of the second top conductive segment 114c, and a sidewall of the second piezoelectric layer 112. Further, a ledge 114d1 of the third top conductive segment 114d is in direct contact with the third conductive via 126. A ledge 114e1 of the fourth top conductive segment 114e is in direct contact with the third conductive via 126. A ledge 110b1 of the first middle conductive segment 110b is in direct contact with the third conductive via 126 and a ledge 110c1 of the second middle conductive segment 110c is in direct contact with the third conductive via 126.

In some embodiments, the plurality of conductive layers 106, 110, 114 may, for example, be or comprise molybdenum (e.g., molybdenum (VI)), nickel, or the like. In some embodiments, the plurality of piezoelectric layers 104, 108, 112, 116 may, for example, be or comprise a piezoelectric material, such as aluminum nitride, zinc oxide, or the like. In some embodiments, the masking layer 118 may, for example, be or comprise silicon oxide, silicon carbide, silicon nitride, or the like. In some embodiments, the plurality of conductive vias 122, 124, 126 may, for example, be or comprise aluminum, copper, or the like. In some embodiments, the substrate 102 may, for example, be or comprise a bulk substrate (e.g., a bulk silicon substrate), monocrystalline silicon, P doped silicon, N doped silicon, or the like.

Figure 4A:
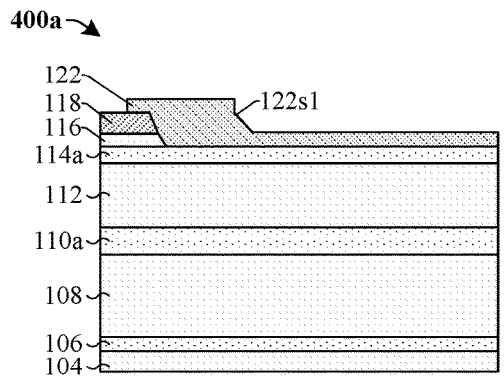
FIGS. 4A-4C illustrate cross-sectional views of some embodiments of close-up views of sections of the piezoelectric structure of FIG. 3.

Referring to FIG. 4A, some embodiments of a cross-sectional view 400a of a portion of the piezoelectric structure 300 of FIG. 3, as indicated by the dashed outline box shown in FIG. 3 is provided.

As seen in the cross-sectional view 400a, the first conductive via 122 continuously extends from a top surface of the masking layer 118 to a top surface of the top electrode 114a. A first sidewall 122s1 of the first conductive via 122 conforms to a slanted shape of a sidewall of the masking layer 118 and a sidewall of the top piezoelectric layer 116. Therefore, the first sidewall 122s1 comprises a vertical segment overlying a slanted segment.

Figure 4B:
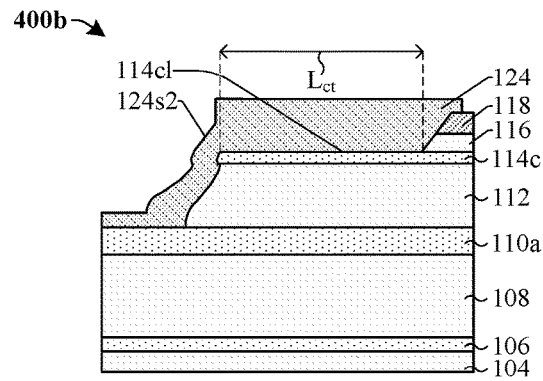

Referring to FIG. 4B, some embodiments of a cross-sectional view 400b of a portion of the piezoelectric structure 300 of FIG. 3, as indicated by the dashed outline box shown in FIG. 3 is provided.

As seen in the cross-sectional view 400b, the second conductive via 124 continuously extends from a top surface of the masking layer 118 to a top surface of the middle electrode 110a. The second sidewall 124s2 of the second conductive via 124 conforms to a slanted shape of a sidewall of the masking layer 118 and a sidewall of the top piezoelectric layer 116. The second sidewall 124s2 of the second conductive via 124 conforms to a curved shaped of a sidewall of the second top conductive segment 114c and a sidewall of the second piezoelectric layer 112. In some embodiments, the second top conductive segment 114c overhangs the second piezoelectric layer 112 due to an under-etch process performed during fabrication of the piezoelectric structure 300. A length $L_{ct}$ of the ledge 114c1 of the second top conductive segment 114c is in direct contact with the second conductive via 124. In some embodiments, the length $L_{ct}$ is greater than approximately 50 Angstroms or is within a range of approximately 50 to 750 Angstroms.

Figure 4C:
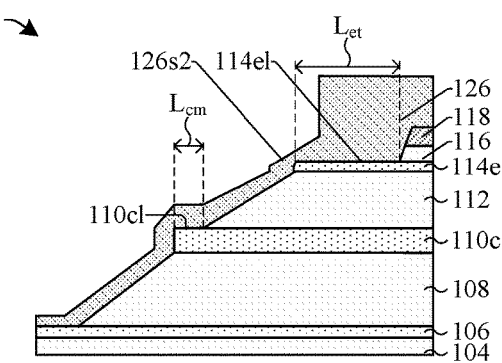

Referring to FIG. 4C, some embodiments of a cross-sectional view 400c of a portion of the piezoelectric structure 300 of FIG. 3, as indicated by the dashed outline box shown in FIG. 3 is provided.

As seen in the cross-sectional view 400c, the third conductive via 126 continuously extends from a top surface of the masking layer 118 to a top surface of the bottom conductive layer 106. A second sidewall 126s2 of the third conductive via 126 conforms to a slanted shape of a sidewall of the masking layer 118 and a sidewall of the top piezoelectric layer 116. The second sidewall 126s2 of the third conductive via 126 conforms to a shape of a sidewall of the fourth top conductive segment 114e and a slanted sidewall of the second piezoelectric layer 112. The second sidewall 126s2 conforms to a ledge 110c1 and a sidewall of the second middle conductive segment 110c. The second sidewall 126s2 extends along and conforms to a slanted shape of a sidewall of the first piezoelectric layer 108. A length $L_{et}$ of the ledge 114e1 of the fourth top conductive segment 114e is in direct contact with the third conductive via 126. In some embodiments, the length $L_{et}$ is greater than approximately 50 Angstroms or within a range of approximately 50 to 750 Angstroms. In some embodiments, a length $L_{cm}$ of the ledge 110c1 is greater than approximately 50 Angstroms or within a range of approximately 50 to 500 Angstroms. In some embodiments, the length $L_{cm}$ is less than the length $L_{et}$.

Figure 5:
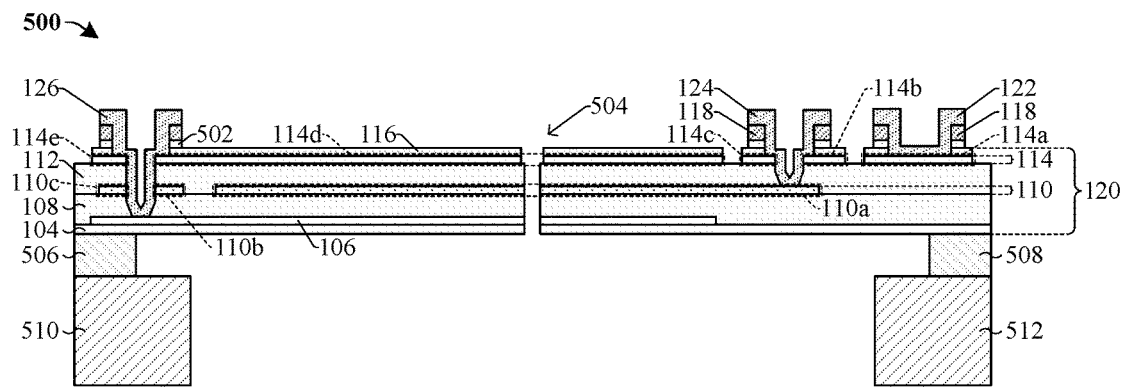
FIG. 5 illustrates a cross-sectional view of some alternative embodiments of the piezoelectric structure of FIG. 1.

Referring to FIG. 5, a cross-sectional view of a piezoelectric device 500 according to some embodiments is provided. The piezoelectric device 500 includes some embodiments of the piezoelectric structure 100 of FIG. 1.

The piezoelectric device 500 includes an embodiment of the piezoelectric structure (100 of FIG. 1) in which the plurality of conductive layers 106, 110, 114 and the first, second, and third conductive vias 122, 124, 126 have a different layout. An uppermost conductive layer 502 is disposed between the masking layer 118 and the top piezoelectric layer 116. The third conductive via 126 is laterally offset the first and second conductive vias 122, 124 by a center cavity 504. The center cavity 504 extends through the piezoelectric membrane 120. In some embodiments, the center cavity 504 may comprise a circular shape.

A bottom piezoelectric layer 104 underlying the bottom conductive layer 106 is bonded to carrier substrates 510, 512 through lower oxide layers 506, 508. In some embodiments, the carrier substrates 510, 512 may, for example, be or comprise a bulk substrate (e.g., a bulk silicon substrate), monocrystalline silicon, P doped silicon, N doped silicon, or the like. In some embodiments, the lower oxide layers 506, 508 may, for example, be or comprise an oxide, silicon oxide, or the like. In some embodiments, the piezoelectric device 500 is configured as a piezoelectric microphone, in which, the center cavity 504 is configured to allow acoustic sound waves to pass through the piezoelectric membrane 120. During operation of the piezoelectric device 500, an incident sound wave applies a force on on the piezoelectric membrane 120. The force causes the plurality of piezoelectric layers 104, 108, 112 to generate voltages, which are output by way of at least two conductive vias of the first, second, and third conductive vias 122, 124, 126. The voltages output by the conductive vias 122, 124 and/or 126 may be provided to a digital signal processing element configured to convert the voltage to a digital signal.

Figure 6A:
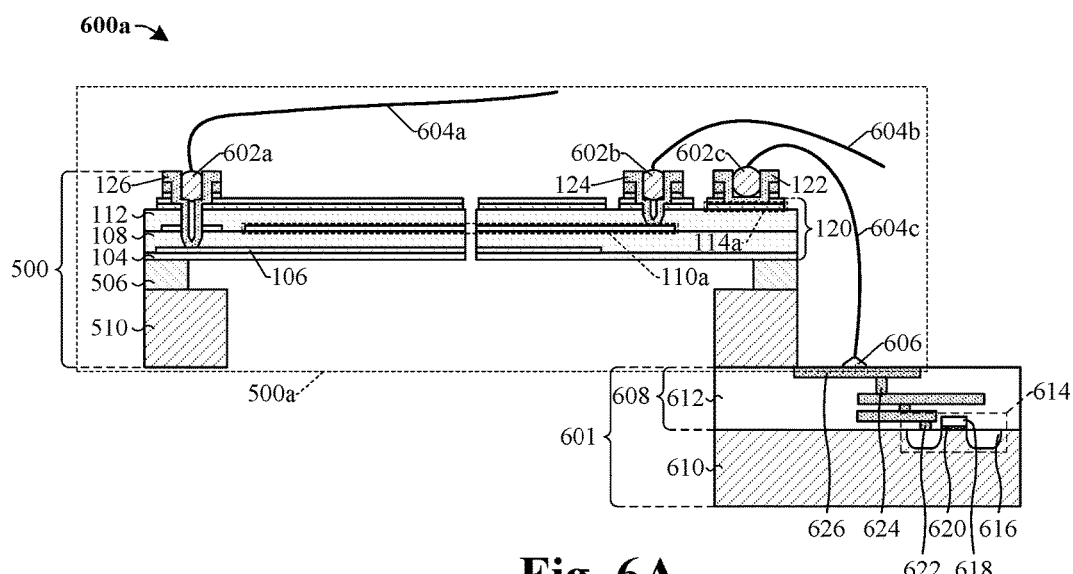
FIGS. 6A and 6B illustrate cross-sectional views of some embodiments of an integrated chip including the piezoelectric structure of FIG. 5 wire bonded to a complementary metal-oxide-semiconductor (CMOS) integrated circuit (IC) die.

Referring to FIG. 6A, a cross-sectional view of an integrated chip 600a according to some embodiments is provided. The integrated chip 600a includes the piezoelectric device 500 of FIG. 5 bonded to a complementary metal-oxide-semiconductor (CMOS) integrated circuit (IC) die 601.

The integrated chip 600a includes the piezoelectric device 500 overlying the CMOS IC die 601. The CMOS IC die 601 includes a back-end-of-line (BEOL) metallization stack 608 overlying a CMOS substrate 610. An inter-level dielectric (ILD) structure 612 is between the CMOS substrate 610 and the piezoelectric device 500. The CMOS substrate 610 and the ILD structure 612 include electronic components such as transistor(s) 614, and/or other electronic components (not shown), such as, one or more capacitors, resistors, inductors, or diodes. The transistor 614 comprises source/drain regions 616, gate electrode 618, and gate dielectric 620. The CMOS substrate 610 may, for example, be or comprise a bulk semiconductor substrate or a SOI substrate. The BEOL metallization stack 608 includes the ILD structure 612, interconnect wires 626, interconnect vias 624, and conductive contacts 622. The ILD structure 612 may comprise one or more stacked ILD layers, which respectively comprise a low κ dielectric (i.e., a dielectric with a dielectric constant less than about 3.9), an oxide, or the like. The interconnect wires 626, the interconnect vias 624, and the conductive contacts 622 may, for example, be or comprise a conductive material, aluminum, copper, tungsten, or the like.

A plurality of solder balls 602a, 602b, 602c are disposed within inner sidewalls of the first, second, and third conductive vias 122, 124, 126, respectively. The plurality of solder balls 602a, 602b, 602c provide contact points for a plurality of bond wires 604a, 604b, 604c, respectively. A bond pad 606 overlies an interconnect wire 626 and provides a wire bonding location for the bond wire 604c. The bond wire 604c directly contacts the bond pad 606 and the solder ball 602c. In some embodiments, the piezoelectric device 500, the plurality of solder balls 602a, 602b, 602c, and the plurality of bond wires 604a, 604b, 604c define a first piezoelectric microphone 500a. It may be appreciated that in other embodiments, the piezoelectric device 500 may be configured as any piezoelectric device such as a piezoelectric sensor, piezoelectric actuator, etc., and therefore FIG. 6A is merely an example.

Figure 6B:
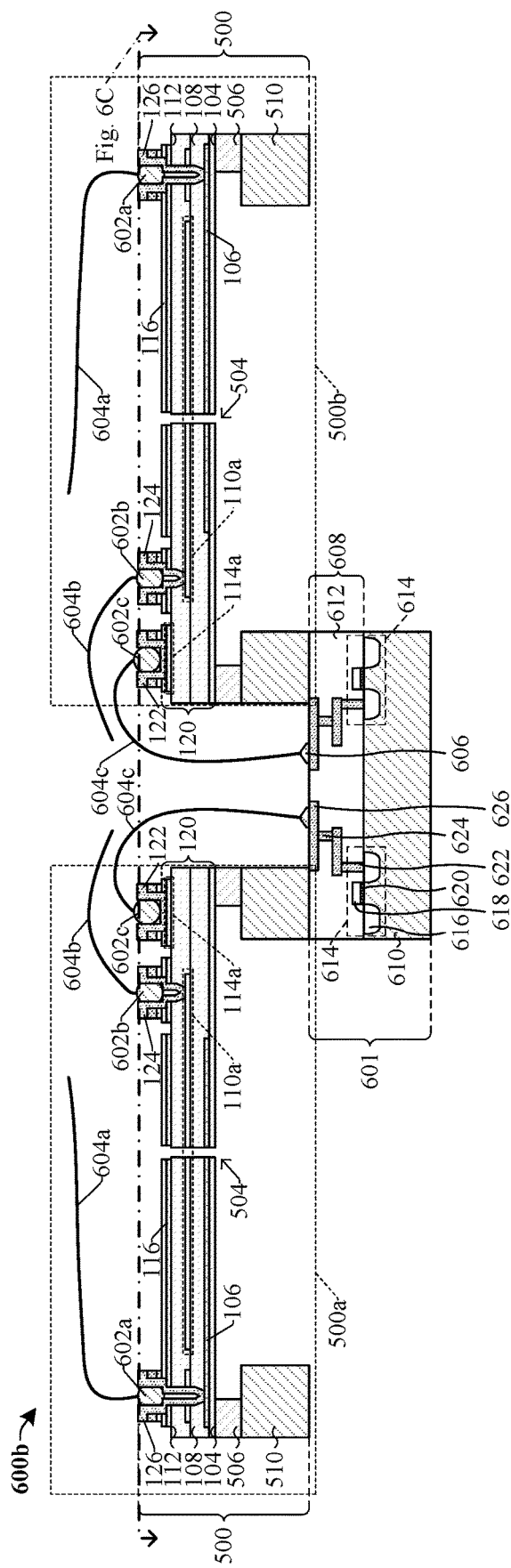

Referring to FIG. 6B, a cross-sectional view of an integrated chip 600b according to some embodiments is provided. The integrated chip 600b includes the first piezoelectric microphone 500a of FIG. 6A bonded to the complementary metal-oxide-semiconductor (CMOS) integrated circuit (IC) die 601.

The integrated chip 600b includes the first piezoelectric microphone 500a laterally offset a second piezoelectric microphone 500b by the CMOS IC die 601. The integrated chip 600b further includes a third piezoelectric microphone and a fourth piezoelectric microphone bonded to the CMOS IC die 601 (not shown). The first and second piezoelectric microphones 500a, 500b are electrically coupled to transistors 614 through interconnect wires 626. In some embodiments, the first and second piezoelectric microphones 500a, 500b are electrically coupled to other electronic components such as one or more capacitor(s), resistor(s), inductor(s), and/or diode(s) (not shown).

Figure 6C:
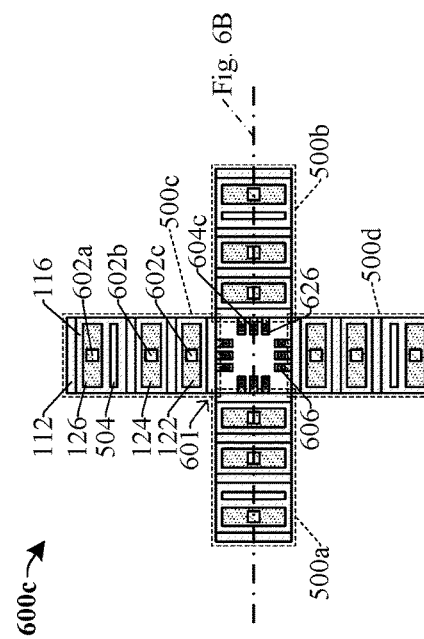
FIG. 6C illustrates some embodiments of a top view of the integrated chip of FIG. 6B, as indicated by the cut-line in FIG. 6B.

Referring to FIG. 6C, some embodiments of a top view 600c of the integrated chip 600b of FIG. 6B as indicated by the cut-away lines shown in FIGS. 6B and 6C is provided.

As seen in FIG. 6B, the cut-away line for FIG. 6C is along a top surface of the plurality of conductive vias 122, 124, 126. As seen in the top view 600c, a third piezoelectric microphone 500c and a fourth piezoelectric microphone 500d are laterally offset one another by the CMOS IC die 601. The third and fourth piezoelectric microphones 500c, 500d are electrically coupled to electronic components (e.g., transistors 614 of FIG. 6B) disposed within the CMOS IC die 601. In some embodiments, the third and fourth piezoelectric microphones 500c, 500d respectively comprise the same layout and function as the first piezoelectric microphone 500a.

Figure 6D:
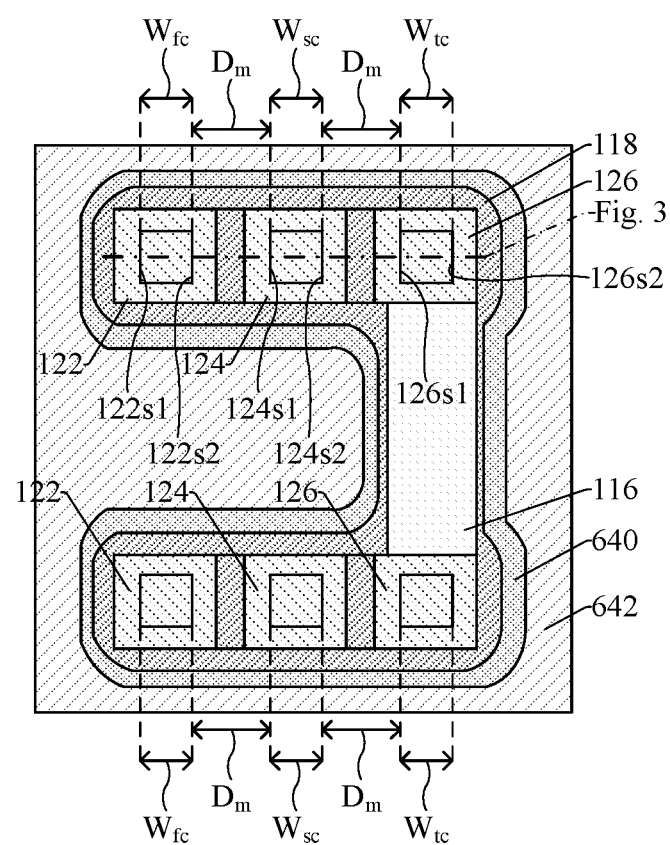
FIG. 6D illustrates some embodiments of a top view of the piezoelectric structure of FIG. 3, as indicated by the cut-line in FIG. 3.

Referring to FIG. 6D, some embodiments of a top view 600d of the piezoelectric structure 300 of FIG. 3 as indicated by the cut-away lines shown in FIGS. 3 and 6D is provided.

As seen in FIG. 3, the cut-away line for FIG. 6D is along a top surface of the plurality of conductive vias 122, 124, 126. As seen in the top view 600d the masking layer 118 is surrounded by a dielectric layer 640. The dielectric layer 640 is surrounded by a top ILD layer 642. A first sidewall 122s1 of the first conductive via 122 is separated from a second sidewall 122s2 of the first conductive via 122 by a first width $W_{fc}$. The first width $W_{fc}$ is within a range of approximately 3 to 7 micrometers. In some embodiments, the first width $W_{fc}$ decreases from a top surface of the first conductive via 122 to a bottom surface of the first conductive via 122. A first sidewall 124s1 of the second conductive via 124 is separated from a second sidewall 124s2 of the second conductive via 124 by a second width $W_{sc}$. The second width $W_{sc}$ is within a range of approximately 3 to 7 micrometers. In some embodiments, the second width $W_{sc}$ decreases from a top surface of the second conductive via 124 to a bottom surface of the second conductive via 124. A first sidewall 126s1 of the third conductive via 126 is separated from a second sidewall 126s2 of the third conductive via 126 by a third width $W_{tc}$. The third width $W_{tc}$ is within a range of approximately 3 to 7 micrometers. In some embodiments, the third width $W_{tc}$ decreases from a top surface of the third conductive via 126 to a bottom surface of the third conductive via 126. In some embodiments, the first, second, and third widths $W_{fc}$, $W_{se}$, $W_{tc}$ at the top surface of the first, second, and third conductive vias 122, 124, 126 are approximately equal.

In some embodiments, a maximum distance $D_m$ between sidewalls of two adjacent conductive vias is equal to or less than approximately 8 micrometers. For example, the maximum distance $D_m$ between the second sidewall 122s2 of the first conductive via 122 and the first sidewall 124s1 of the second conductive via 124 is equal to or less than approximately 8 micrometers. In yet another example, the maximum distance $D_m$ between the second sidewall 124s2 of the second conductive via 124 and the first sidewall 126s1 of the third conductive via 126 is equal to or less than approximately 8 micrometers. In some embodiments, the maximum distance $D_m$ between sidewalls of each adjacent conductive via is approximately equal.

FIGS. 7-14 illustrate cross-sectional views 700-1400 of some embodiments of a method of forming a piezoelectric structure according to the present disclosure. Although the cross-sectional views 700-1400 shown in FIGS. 7-14 are described with reference to a method, it will be appreciated that the structures shown in FIGS. 7-14 are not limited to the method but rather may stand alone separate of the method. Although FIGS. 7-14 are described as a series of acts, it will be appreciated that these acts are not limiting in that the order of the acts can be altered in other embodiments, and the methods disclosed are also applicable to other structures.

Figure 7:
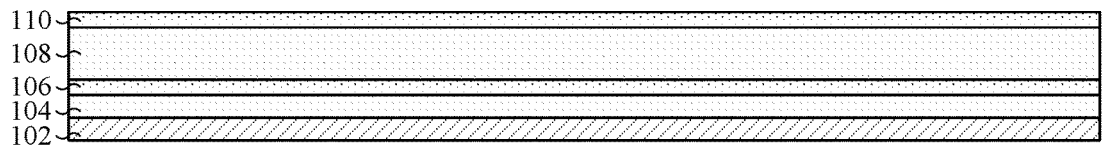
FIGS. 7-14 illustrate cross-sectional views of some embodiments of forming a piezoelectric structure including a piezoelectric membrane with three vias and three electrodes.

As shown in cross-sectional view 700 of FIG. 7, a substrate 102 is provided and a bottom piezoelectric layer 104 is formed over the substrate 102. A bottom conductive layer 106 comprising a bottom electrode is formed over the bottom piezoelectric layer 104. A first piezoelectric layer 108 is formed over the bottom conductive layer 106. A middle conductive layer 110 is formed over the first piezoelectric layer 108.

Figure 8:
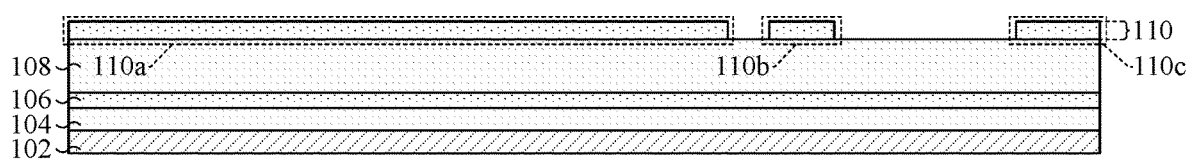

As shown in cross-sectional view 800 of FIG. 8, the middle conductive layer 110 is patterned, thus defining a middle electrode 110a, a first middle conductive segment 110b, and a second middle conductive segment 110c. In some embodiments, the patterning process is performed by forming a masking layer (e.g., photoresist) over the middle conductive layer 110, performing an etch into the middle conductive layer 110 with the masking layer in place, and removing the masking layer (not shown).

Figure 9:
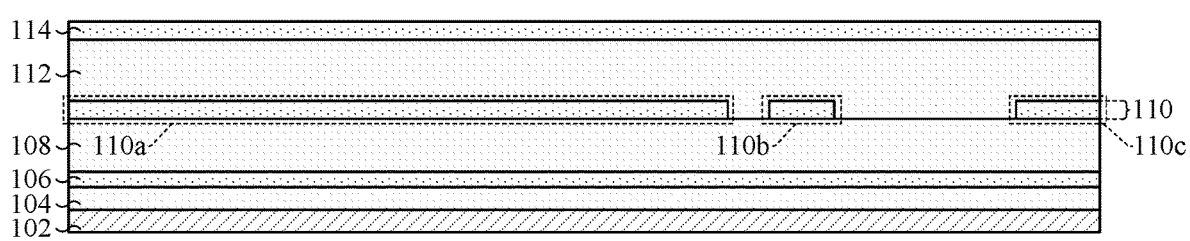

As shown in cross-sectional view 900 of FIG. 9, a second piezoelectric layer 112 is formed over the middle conductive layer 110 and the first piezoelectric layer 108. A top conductive layer 114 is formed over the second piezoelectric layer 112.

Figure 10:
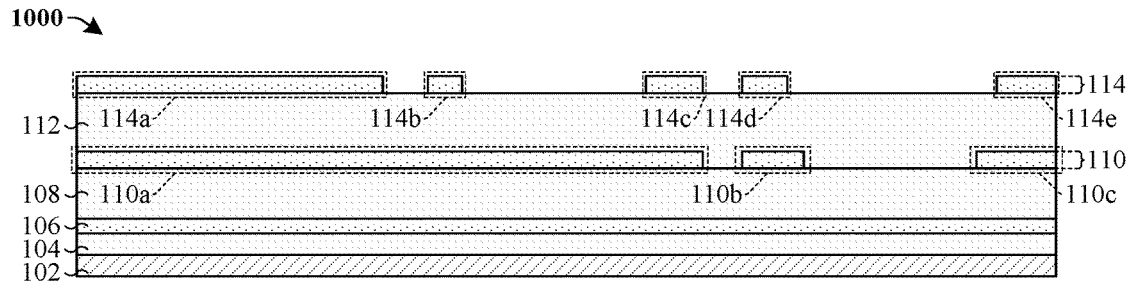

As shown in cross-sectional view 1000 of FIG. 10, the top conductive layer 114 is patterned, thus defining a top electrode 114a, a first top conductive segment 114b, a second top conductive segment 114c, a third top conductive segment 114d, and a fourth top conductive segment 114e. In some embodiments, the patterning process is performed by forming a masking layer over the top conductive layer 114, performing an etch into the top conductive layer 114 with the masking layer in place, and removing the masking layer (not shown).

Figure 11:
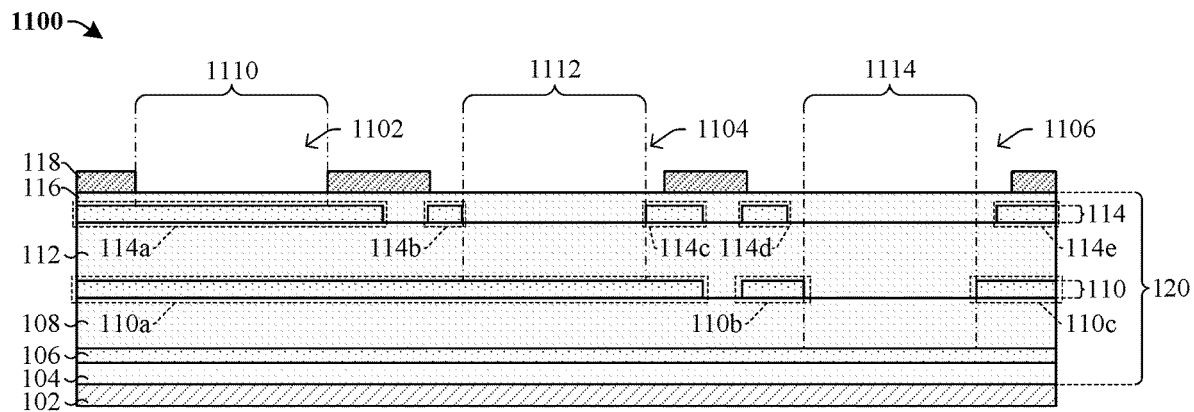

As shown in cross-sectional view 1100 of FIG. 11, a top piezoelectric layer 116 is formed over the top conductive layer 114 and the second piezoelectric layer 112. A masking layer 118 is formed over the top piezoelectric layer 116. The masking layer 118 comprises a plurality of opposing sidewalls that respectively define a plurality of openings 1102, 1104, 1106.

A first sacrificial region 1110 is defined above an upper surface of the top electrode 114a. A second sacrificial region 1112 is defined above an upper surface of the middle electrode 110a. A third sacrificial region 1114 is defined above an upper surface of the bottom conductive layer 106. The first, second, and third sacrificial regions 1110, 1112, 1114 comprise piezoelectric material absent any conductive material. In some embodiments, the first, second, and third sacrificial regions 1110, 1112, 1114 comprise a single piezoelectric material (e.g., aluminum nitride). In some embodiments, there is no conductive material within the first, second, and third sacrificial regions 1110, 1112, 1114. The first, second, and third sacrificial regions 1110, 1112, 1114 are within the plurality of opposing sidewalls of the masking layer 118 that define the plurality of openings 1102, 1104, 1106.

Figure 12:
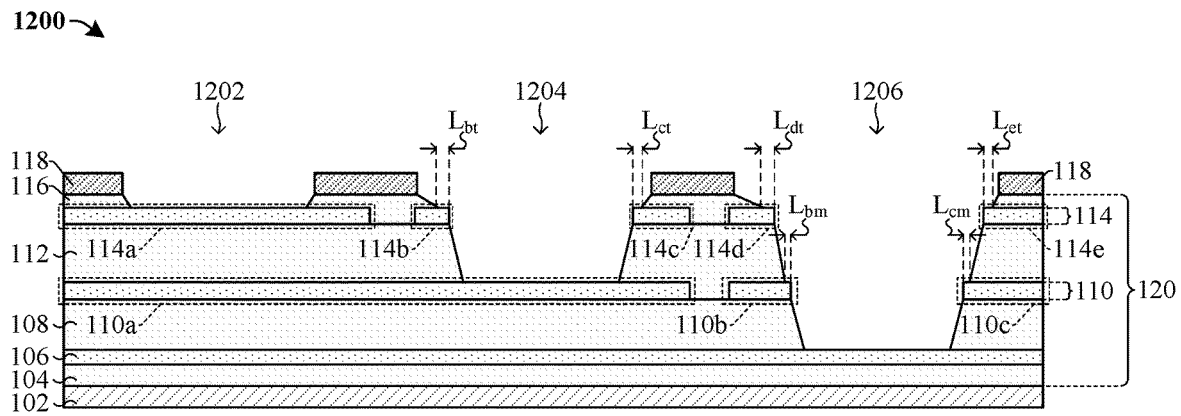

As shown in cross-sectional view 1200 of FIG. 12, the first piezoelectric layer 108, the second piezoelectric layer 112, and the top piezoelectric layer 116 are patterned according to the masking layer 118. The patterning process may, for example, include performing an etch process into the first piezoelectric layer 108, the second piezoelectric layer 112, and the top piezoelectric layer 116. The etch process may, for example, be a wet etch that includes exposing the first piezoelectric layer 108, the second piezoelectric layer 112, and the top piezoelectric layer 116 to an etchant at a temperature within a range of approximately 130 to 160 degrees Celsius. In some embodiments, the etchant comprises at least 85 percent phosphoric acid and/or may comprise 15 percent or less of another chemical (e.g., hydrofluoric acid, potassium hydroxide, tetramethylammonium hydroxide, etc.). The etch process defines a plurality of conductive via openings 1202, 1204, 1206 directly above the plurality of opposing sidewalls in the masking layer 118. In some embodiments, the etch process is a single wet etch process that concurrently forms the plurality of conductive via openings 1202, 1204, 1206.

In some embodiments, the etch process removes a portion of the top piezoelectric layer 116 overlying the first top conductive segment 114b defining a ledge of the first top conductive segment 114b. The ledge of the first top conductive segment 114b comprises a length $L_{bt}$ greater than approximately 50 Angstroms or within a range of approximately 50 to 750 Angstroms. The etch process removes a portion of the top piezoelectric layer 116 overlying the second top conductive segment 114c defining a ledge of the second top conductive segment 114c. The ledge of the second top conductive segment 114c comprises a length $L_{ct}$ greater than approximately 50 Angstroms or within a range of approximately 50 to 750 Angstroms. In some embodiments, the length $L_{ct}$ is less than the length $L_{bt}$. The etch process removes a portion of the top piezoelectric layer 116 overlying the third top conductive segment 114d defining a ledge of the third top conductive segment 114d. The ledge of the third top conductive segment 114d comprises a length $L_{dt}$ greater than approximately 50 Angstroms or within a range of approximately 50 to 750 Angstroms. The etch process removes a portion of the top piezoelectric layer 116 overlying the fourth top conductive segment 114e defining a ledge of the fourth top conductive segment 114e. The ledge of the fourth top conductive segment 114e comprises a length $L_{et}$ greater than approximately 50 Angstroms or within a range of approximately 50 to 750 Angstroms.

In some embodiments, the etch process removes a portion of the second piezoelectric layer 112 overlying the first middle conductive segment 110b defining a ledge of the first middle conductive segment 110b. The ledge of the first middle conductive segment 110b comprises a length $L_{bm}$ greater than approximately 50 Angstroms or within a range of approximately 50 to 750 Angstroms. In some embodiments, the etch process removes a portion of the second piezoelectric layer 112 overlying the second middle conductive segment 110c defining a ledge of the second middle conductive segment 110c. The ledge of the second middle conductive segment 110c comprises a length $L_{cm}$ greater than approximately 50 Angstroms or within a range of approximately 50 to 750 Angstroms. In some embodiments, the length $L_{bm}$ and the length $L_{cm}$ are approximately equal.

Figure 13:
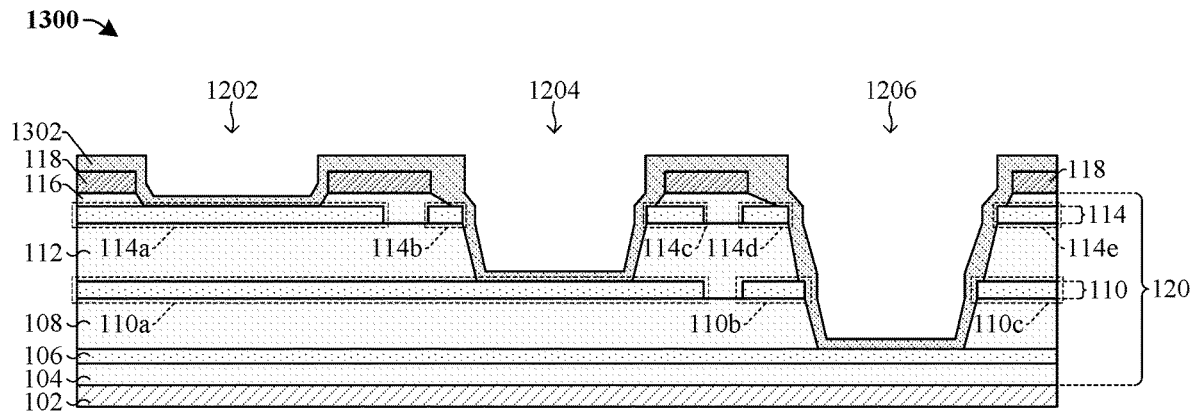

As shown in cross-sectional view 1300 of FIG. 13, a conductive via layer 1302 is formed over the piezoelectric membrane 120. The conductive via layer 1302 fills the plurality of conductive via openings 1202, 1204, 1206.

Figure 14:
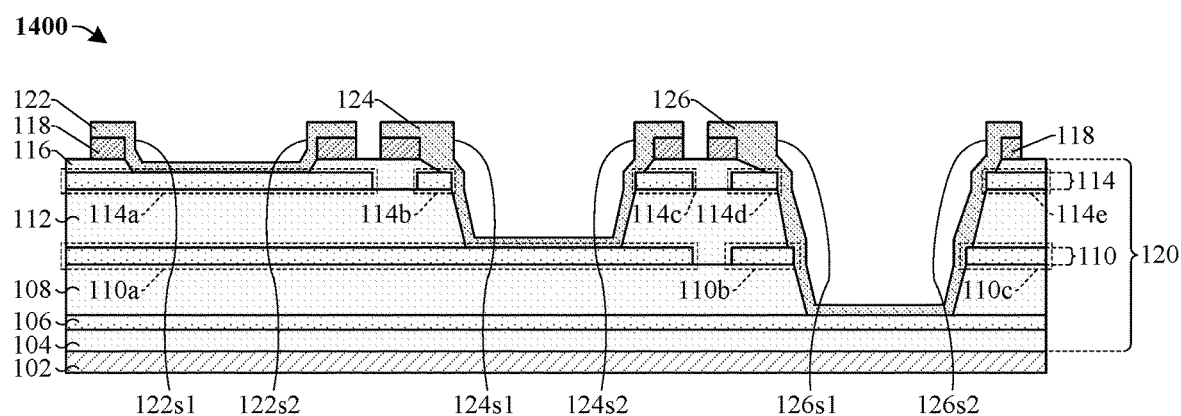

As shown in cross-sectional view 1400 of FIG. 14, the conductive via layer (1302 of FIG. 13) and the masking layer 118 are patterned to define a first conductive via 122, a second conductive via 124, and a third conductive via 126. In some embodiments, the patterning process is performed by forming a masking layer over the conductive via layer (1302 of FIG. 13), performing an etch into the conductive via layer (1302 of FIG. 13) and masking layer 118 with the masking layer in place, and removing the masking layer (not shown).

FIGS. 7-14 illustrates some embodiments of a method of forming a piezoelectric structure with three electrodes respectively coupled to three conductive vias. It may be appreciated that in some embodiments, the method outlined in FIGS. 7-14 may, for example, be used to form a piezoelectric structure with N electrodes (N is a positive whole number greater than 1) and N conductive vias. In some embodiments, the method used to form the piezoelectric structure with N electrodes and N conductive vias utilizes a single photomask and a single etch process (e.g., a wet etch process) to concurrently expose an upper surface of each electrode in the N electrodes before forming the N conductive vias (not shown).

Figure 15:
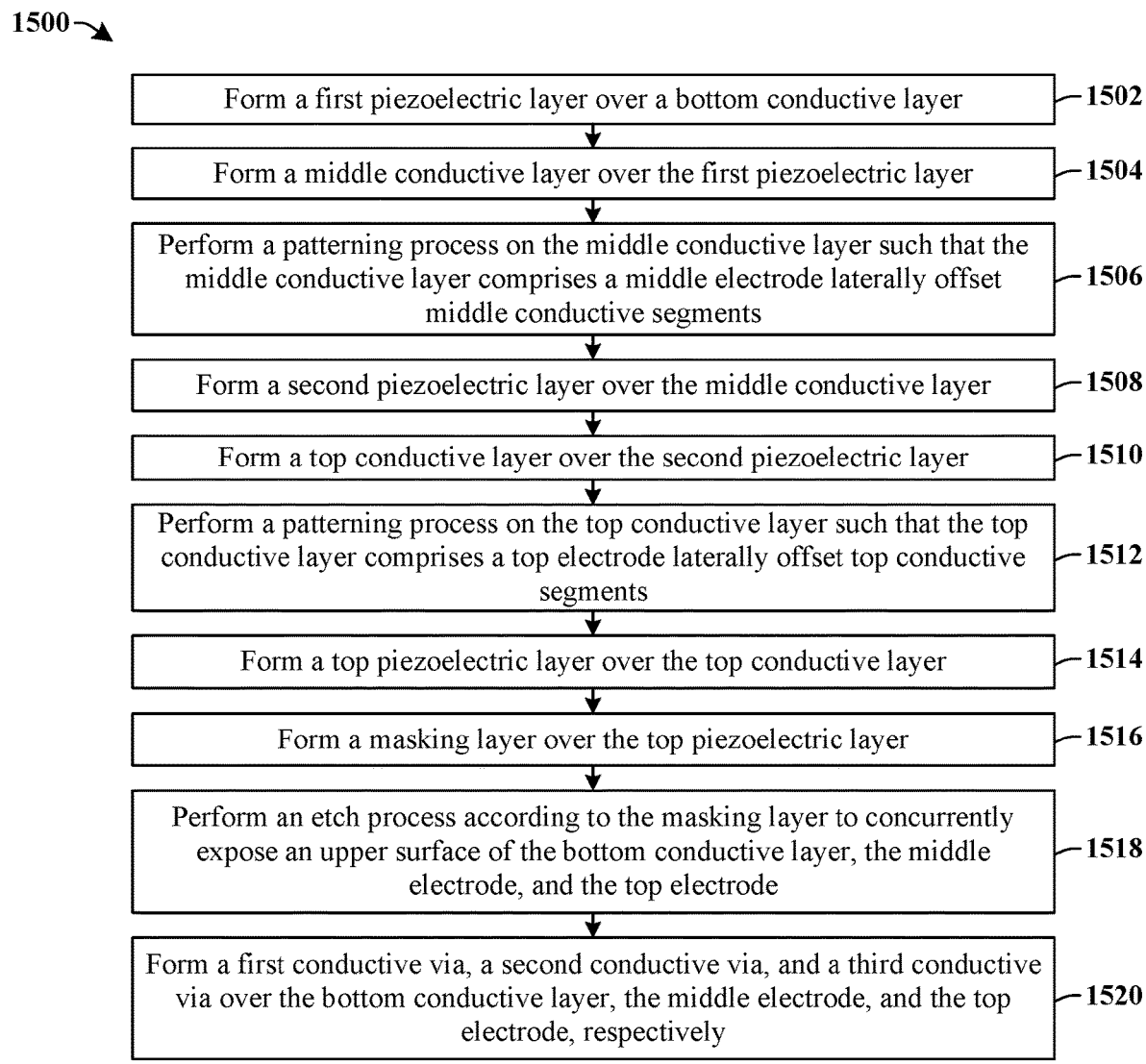
FIG. 15 illustrates a methodology in flowchart format that illustrates some embodiments of a method of forming a piezoelectric structure.

FIG. 15 illustrates a method 1500 of forming a piezoelectric structure in accordance with some embodiments. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1502, a first piezoelectric layer is formed over a bottom conductive layer. FIG. 7 illustrates a cross-sectional view 700 corresponding to some embodiments of act 1502.

At 1504, a middle conductive layer is formed over the first piezoelectric layer. FIG. 7 illustrates a cross-sectional view 700 corresponding to some embodiments of act 1504.

At 1506, a patterning process is performed on the middle conductive layer such that the middle conductive layer comprises a middle electrode laterally offset middle conductive segments. FIG. 8 illustrates a cross-sectional view 800 corresponding to some embodiments of act 1506.

At 1508, a second piezoelectric layer is formed over the middle conductive layer. FIG. 9 illustrates a cross-sectional view 900 corresponding to some embodiments of act 1508.

At 1510, a top conductive layer is formed over the second piezoelectric layer. FIG. 9 illustrates a cross-sectional view 900 corresponding to some embodiments of act 1510.

At 1512, a patterning process is performed on the top conductive layer such that the top conductive layer comprises a top electrode laterally offset top conductive segments. FIG. 10 illustrates a cross-sectional view 1000 corresponding to some embodiments of act 1512.

At 1514, a top piezoelectric layer is formed over the top conductive layer. FIG. 11 illustrates a cross-sectional view 1100 corresponding to some embodiments of act 1514.

At 1516, a masking layer is formed over the top piezoelectric layer. FIG. 11 illustrates a cross-sectional view 1100 corresponding to some embodiments of act 1516.

At 1518, an etch process is performed according to the masking layer to concurrently expose an upper surface of the bottom conductive layer, the middle electrode, and the top electrode. FIG. 12 illustrates a cross-sectional view 1200 corresponding to some embodiments of act 1518.

At 1520, a first conductive via, a second conductive via, and a third conductive via are formed over the bottom conductive layer, the middle electrode, and the top electrode, respectively. FIGS. 13 and 14 illustrate cross-sectional views 1300 and 1400 corresponding to some embodiments of act 1520.

Accordingly, in some embodiments, the present disclosure relates to a method of forming a piezoelectric structure that includes performing a single etch process to expose an upper surface of a plurality of electrodes within a piezoelectric membrane. A plurality of conductive vias are formed over the upper surface of the plurality of electrodes.

In some embodiments, the present application provides a method for forming a piezoelectric device, the method includes forming a plurality of conductive layers in a piezoelectric membrane, the plurality of conductive layers are vertically offset one another; forming a masking layer over the piezoelectric membrane; performing an etch process according to the masking layer to concurrently expose an upper surface of each conductive layer in the plurality of conductive layers; and forming a plurality of conductive vias over the upper surface of the plurality of conductive layers.

In some embodiments, the present application provides a method for forming a piezoelectric structure, the method includes forming a plurality of electrodes in a piezoelectric membrane, the plurality of electrodes are vertically separated by piezoelectric layers and are laterally separated from a plurality of conductive segments; etching the piezoelectric membrane to concurrently expose an upper surface of each electrode in the plurality of electrodes by removing sacrificial regions of the piezoelectric membrane that are above each electrode in the plurality of electrodes and that are between sidewalls of conductive segments, the plurality of electrodes and the plurality of conductive segments are laterally and vertically outside of the sacrificial regions; forming a conductive layer over the piezoelectric membrane; and patterning the conductive layer to define a plurality of vias overlying the upper surface of each electrode in the plurality of electrodes.

In some embodiments, the present application provides a piezoelectric device, including a semiconductor substrate; a plurality of conductive layers over the semiconductor substrate; a plurality of piezoelectric layers separating the plurality of conductive layers from one another; and a plurality of conductive vias extending through one or more of the plurality of piezoelectric layers, a bottommost surface of the plurality of conductive vias respectively continuously extends along an upper surface of a conductive layer in the plurality of conductive layers, and at least one conductive via comprises inner sidewalls that respectively comprise a first vertical segment over a first slanted segment and a second vertical segment over a second slanted segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a piezoelectric device, the method comprising:
    forming a plurality of conductive layers in a piezoelectric membrane, wherein the plurality of conductive layers are vertically offset one another, wherein the piezoelectric membrane has an initial thickness above each conductive layer immediately after forming the plurality of conductive layers;
    forming a masking layer over the piezoelectric membrane;
    performing an etch process while the masking layer is disposed on the piezoelectric membrane to concurrently expose an upper surface of each conductive layer in the plurality of conductive layers, wherein the etch process comprises a wet etch, and wherein the piezoelectric membrane comprises the initial thickness above each conductive layer immediately before the etch process; and
    forming a plurality of conductive vias over the upper surface of the plurality of conductive layers, wherein the plurality of conductive vias comprises a first via, a second via, and a third via, wherein the second via is spaced laterally between the first and third vias.

2. A method for forming a piezoelectric device, the method comprising:
    forming a plurality of conductive layers in a piezoelectric membrane, wherein the plurality of conductive layers are vertically offset one another, wherein the plurality of conductive layers comprises a first conductive layer having a first electrode, a second conductive layer having a second electrode, and a third conductive layer, wherein the second conductive layer is vertically between the first and third conductive layers;
    forming a masking layer over the piezoelectric membrane;
    performing an etch process on the piezoelectric membrane, wherein the piezoelectric membrane is removed from at least a portion of an upper surface of each conductive layer in the plurality of conductive layers, wherein the etch process is a wet etch comprising an etchant of at least 85 percent phosphoric acid; and
    forming a plurality of conductive vias over the upper surface of the plurality of conductive layers, wherein the plurality of conductive vias comprises a first via contacting the first electrode, a second via contacting the second electrode, and a third via contacting the third conductive layer, wherein the third via contacts a top surface of a first segment of the second conductive layer, wherein the first segment is laterally offset the second electrode.

3. A method for forming a piezoelectric device, the method comprising:
    forming a plurality of conductive layers in a piezoelectric membrane, wherein the plurality of conductive layers are vertically offset one another;
    forming a masking layer over the piezoelectric membrane, wherein the masking layer comprises sidewalls defining a first masking layer opening, a second masking layer opening, and a third masking layer opening;
    performing an etch process on the piezoelectric membrane, wherein the piezoelectric membrane is removed from at least a portion of an upper surface of each conductive layer in the plurality of conductive layers, wherein the etch process comprises a wet etch, wherein the etch process defines a first via opening directly below the first masking layer opening, a second via opening directly below the second masking layer opening, and a third via opening directly below the third masking layer opening;
    forming a plurality of conductive vias over the upper surface of the plurality of conductive layers, wherein forming the plurality of conductive vias comprises forming a conductive via layer over the piezoelectric membrane and performing a patterning process to remove a portion of the conductive via layer and a portion of the masking layer, wherein the patterning process defines a first conductive via within the first via opening, a second conductive via within the second via opening, and a third conductive via within the third via opening; and
    wherein forming the plurality of conductive layers comprises:
        forming a bottom conductive layer;
        forming a first piezoelectric layer over the bottom conductive layer;
        forming a middle conductive layer over the first piezoelectric layer;
        patterning the middle conductive layer such that the middle conductive layer comprises a middle electrode laterally offset middle conductive segments, wherein the middle conductive segments comprise sidewalls defining a middle opening overlying the bottom conductive layer;
        forming a second piezoelectric layer over the middle conductive layer;
        forming a top conductive layer over the second piezoelectric layer;
        patterning the top conductive layer such that the top conductive layer comprises a top electrode laterally offset top conductive segments, wherein the top conductive segments comprise sidewalls defining a first top opening vertically aligned with the middle opening and a second top opening overlying the middle electrode, wherein the second top opening is vertically offset the first top opening, wherein the first masking layer opening overlies the top electrode, the second masking layer opening is vertically aligned with the second top opening, and the third masking layer opening is vertically aligned with the middle opening; and forming a top piezoelectric layer over the top conductive layer, wherein the first, second, and top piezoelectric layers define the piezoelectric membrane.

4. The method according to claim 3, wherein the etch process exposes sidewalls of the middle conductive segments and the top conductive segments.

5. The method according to claim 3, wherein after the etch process the piezoelectric membrane comprises a plurality of slanted sidewalls directly above the bottom conductive layer, the middle electrode, and the top electrode, respectively.

6. The method according to claim 3, wherein the second conductive via contacts the sidewalls of the top conductive segments that define the second top opening, wherein the third conductive via contacts the sidewalls of the top conductive segments that define the first top opening and the sidewalls of the middle conductive segments that define the middle opening.

7. The method according to claim 1, wherein the etch process comprises exposing the piezoelectric membrane to phosphoric acid.

8. The method according to claim 1, wherein the etch process is performed at a temperature within a range of 130 to 160 degrees Celsius.

9. The method according to claim 1, wherein the plurality of conductive layers comprises a plurality of electrodes laterally separated from a plurality of conductive segments, wherein the etch process removes sacrificial regions of the piezoelectric membrane that are above each electrode.

10. The method according to claim 9, wherein the masking layer comprises a plurality of sidewalls defining a plurality of openings that are vertically aligned over the sacrificial regions.

11. The method according to claim 9, wherein the etch process removes a lateral component of the piezoelectric membrane overlying each conductive segment in the plurality of conductive segments.

12. The method according to claim 9, wherein a first conductive via in the plurality of conductive vias directly contacts a first conductive segment in the plurality of conductive segments.

13. The method according to claim 1, wherein the piezoelectric membrane comprises aluminum nitride and the plurality of conductive layers comprise molybdenum.

14. The method according to claim 1, wherein forming the plurality of conductive vias comprises:

forming an upper conductive layer over the piezoelectric membrane, wherein the upper conductive layer contacts sidewalls of the masking layer; and patterning the upper conductive layer to define the plurality of conductive vias.

15. The method according to claim 14, wherein at least a portion of the masking layer is disposed between the plurality of conductive vias and the piezoelectric membrane after patterning the upper conductive layer.

16. The method according to claim 2, wherein forming the plurality of conductive layers comprises:

depositing the first conductive layer over a first piezoelectric layer;

depositing a second piezoelectric layer over the first conductive layer;

depositing the second conductive layer over the second piezoelectric layer; and performing a second etch process on the second conductive layer to define the second electrode, the first segment, and a second segment laterally offset from one another.

17. The method according to claim 16, wherein the third via contacts the second segment of the second conductive layer.

18. The method according to claim 1, wherein the etch process reduces the initial thickness of the piezoelectric membrane above the upper surface of each conductive layer in the plurality of conductive layers.

19. The method according to claim 1, wherein the etch process concurrently forms a first opening, a second opening, and a third opening in the piezoelectric membrane, wherein the first via is disposed in the first opening, the second via is disposed in the second opening, and the third via is disposed in the third opening.

20. The method according to claim 2, wherein the third via contacts a top surface of a segment of the first conductive layer.

* * * * *